(12) United States Patent
Rosca et al.

(10) Patent No.: US 10,469,085 B2
(45) Date of Patent: Nov. 5, 2019

(54) SEAMLESS SWITCHING CONTROL FOR LOW POWER BATTERY BACKUP SYSTEM

(71) Applicants: Gabriel Rosca, Ploiesti (RO); Richard Hull, East Puyallup, WA (US); Zacharias M. Smit, Chandler, AZ (US); Razvan Enachescu, Bucharest (RO); Alexandru Vidrasan, Bucharest (RO)

(72) Inventors: Gabriel Rosca, Ploiesti (RO); Richard Hull, East Puyallup, WA (US); Zacharias M. Smit, Chandler, AZ (US); Razvan Enachescu, Bucharest (RO); Alexandru Vidrasan, Bucharest (RO)

(73) Assignee: MICROCHIP TECHNOLOGY INCORPORATED, Chandler, AZ (US)

( * ) Notice: Subject to any disclaimer, the term of this patent is extended or adjusted under 35 U.S.C. 154(b) by 0 days.

(21) Appl. No.: 15/495,079

(22) Filed: Apr. 24, 2017

(65) Prior Publication Data
US 2017/0310324 A1    Oct. 26, 2017

Related U.S. Application Data

(60) Provisional application No. 62/327,309, filed on Apr. 25, 2016.

(51) Int. Cl.
*H03L 5/00*    (2006.01)
*H03K 19/0185*    (2006.01)
(Continued)

(52) U.S. Cl.
CPC ........ *H03K 19/018521* (2013.01); *H02J 9/06* (2013.01); *H02J 9/061* (2013.01);
(Continued)

(58) Field of Classification Search
None
See application file for complete search history.

(56) References Cited

U.S. PATENT DOCUMENTS 6,359,497 B1 *  3/2002  Criscione ............. H03K 17/693
                                                                327/408
2013/0335152 A1 * 12/2013 Burnette ............. H03K 3/0315
                                                                331/57

(Continued)

OTHER PUBLICATIONS

International Search Report and Written Opinion, Application No. PCT/US2017/029268, 14 pages, dated Jul. 24, 2017.

*Primary Examiner* — Lincoln D Donovan
*Assistant Examiner* — Khareem E Almo
(74) *Attorney, Agent, or Firm* — Slayden Grubert Beard PLLC

(57) ABSTRACT

A circuit for providing back-up power includes a switching circuit configured to be coupled to a first power source and a second power source. The circuit includes a domain voltage level monitor circuit coupled with the first power source and the second power source and with output of the switching circuit. The circuit includes a dynamic level shifter circuit coupled with the first power source and the second power source and an output of the domain voltage level monitor. The circuit includes a double controlled latch circuit coupled with the first power source and the second power source and an output of the dynamic level shifter circuit. The double controlled latch circuit is configured to provide control signals to the switching circuit.

23 Claims, 5 Drawing Sheets

(51) Int. Cl.
*H03K 3/356* (2006.01)
*H03K 5/24* (2006.01)
*H03K 17/693* (2006.01)
*H03K 19/003* (2006.01)
*H02J 9/06* (2006.01)

(52) U.S. Cl.
CPC ..... *H03K 3/356113* (2013.01); *H03K 5/2481* (2013.01); *H03K 17/693* (2013.01); *H03K 19/00315* (2013.01)

(56) References Cited

U.S. PATENT DOCUMENTS

| | | | |
|---|---|---|---|
| 2014/0001861 A1* | 1/2014 | Mann | G06F 1/30 307/66 |
| 2014/0285239 A1 | 9/2014 | Zanetta et al. | 327/64 |
| 2014/0346878 A1* | 11/2014 | Umeyama | H03K 3/012 307/52 |
| 2016/0072485 A1* | 3/2016 | Vice | H03F 1/0255 330/296 |

* cited by examiner

SEAMLESS SWITCHING CONTROL FOR LOW POWER BATTERY BACKUP SYSTEM

PRIORITY

This application claims priority to U.S. Provisional Application 62/327,309 filed on Apr. 25, 2016, which is hereby incorporated in their entirety.

TECHNICAL FIELD

The present disclosure relates to systems with battery backup and, in particular, systems that include microcontrollers with battery backup with seamless switching control.

BACKGROUND

Some systems require a constant power supply and therefore provide for a battery backup in case the main power supply fails. Conventional solutions for switching control are either diode or comparator-based. In a diode-based system, a pair of PN diodes connect the anodes to the supply (+) pins and the common cathode supply the client domain. Comparator-based systems are based on standard fast comparators. The comparator senses the values of the supply voltages, compares them to a reference voltage and further controls the gates of the power switches. The comparators must be able to deal with input common mode ranges that match the supply voltage ranges. Typically, supply ranges in microcontroller systems are between 1.8 and 5.5V.

The drawbacks of the diode solution are, although it would be very area-effective, the DC voltage drop, of about 0.7V, would critically affect the supply range of the overall system. This makes it unsuitable for certain applications because the minimum VDD would increase from, for example, 1.8V to 2.5V.

In a comparator-based system, a lower the filtering capacitance requires a higher comparator speed requirement. In order to be sufficiently fast, the comparators need high bias currents, consequently causing high power consumption. Comparator-based systems also need a large silicon area. If a reference voltage must be provided by a separate circuit, even more area is needed.

SUMMARY

Embodiments of the present disclosure include a circuit for providing back-up power. The circuit may include a switching circuit configured to be coupled to a first power source and a second power source. The circuit may include a domain voltage level monitor circuit coupled with the first power source and the second power source and with output of the switching circuit. The circuit may include a dynamic level shifter circuit coupled with the first power source and the second power source and an output of the domain voltage level monitor. The circuit may include a double controlled latch circuit coupled with the first power source and the second power source and an output of the dynamic level shifter circuit. The double controlled latch circuit may be configured to provide control signals to the switching circuit. In combination with any of the above embodiments, the switching circuit may include two p-channel MOSFETs. In combination with any of the above embodiments, the double controlled latch circuit may be configured to generate complementary output signals fed to the switching circuit. In combination with any of the above embodiments, the double controlled latch circuit may be configured receive a pair of signals as input from the dynamic level shifter circuit. In combination with any of the above embodiments, the double controlled latch circuit may be configured receive a first input signal and a second input signal from the dynamic level shifter circuit. In combination with any of the above embodiments, the first input signal may be communicatively coupled to a drain of a first transistor of the double controlled latch circuit. In combination with any of the above embodiments, the first input signal may be communicatively coupled to a gate of a second transistor of the double controlled latch circuit. In combination with any of the above embodiments, the second input signal may be communicatively coupled to a drain of the second transistor of the double controlled latch circuit. In combination with any of the above embodiments, the second input signal may be communicatively coupled to a gate of the first transistor of the double controlled latch circuit. In combination with any of the above embodiments, the client voltage monitor circuit may be configured to inject a current to drive the dynamic level shifter circuit based upon a difference between the first power source, the second power source, and output of the switching circuit. In combination with any of the above embodiments, the dynamic level shifter circuit may be configured to create voltage drops according to a voltage received from the client voltage monitor circuit.

Embodiments of the present disclosure may include a microcontroller. The microcontroller may include a peripheral circuit and any of the above embodiments of the circuit for providing back-up power. The switching circuit may be configured to provide power to the peripheral circuit.

Embodiments of the present disclosure may include a system. The system may include a first power source, a second power source, a peripheral circuit, and any of the above embodiments of the circuit for providing back-up power. The switching circuit may be configured to provide power to the peripheral circuit.

Embodiments of the present disclosure may include methods performed by any of the circuits, microcontrollers, or systems above.

DETAILED DESCRIPTION

Figure 1:
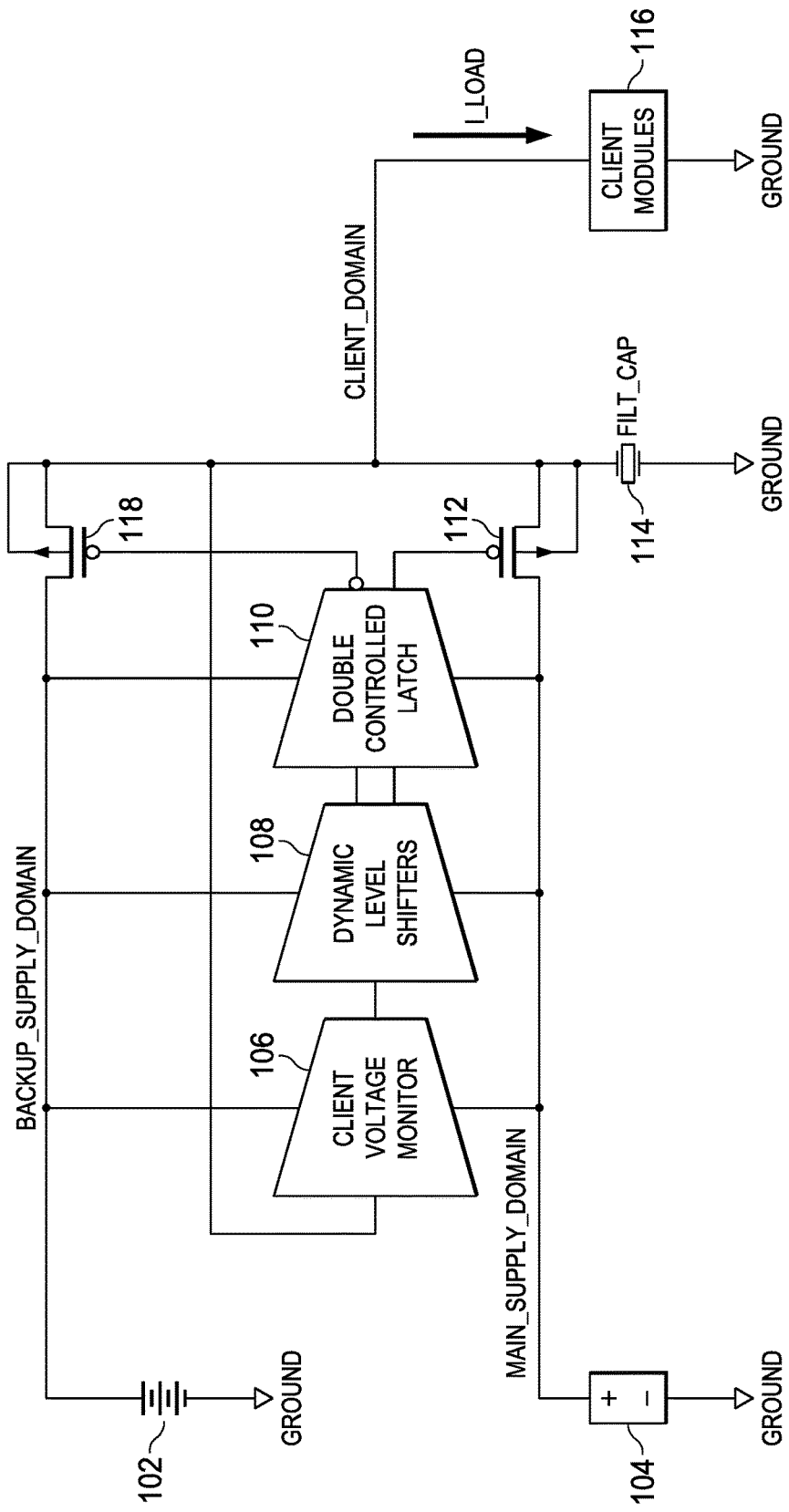
FIG. 1 illustrates a block diagram of a system for seamless switching control, according to embodiments of the present disclosure.

FIG. 1 illustrates a block diagram of a system 100 for seamless switching control, according to embodiments of the present disclosure. In one embodiment, system 100 may include switching control for low power systems. In yet another embodiment, system 100 may include switching control for battery backup systems. Backup and switching control may be performed between any two voltage sources. Although in the present disclosure, while a voltage source may be deemed main, primary, auxiliary, batter, backup, or secondary, the teachings herein may be applied to any two voltage sources, regardless of the relationship between the voltage sources.

In one embodiment, system 100 may perform switching between a main and backup power supply sufficiently fast so that client circuits and their operation is not affected. A switch between power sources may be performed while consumers of the power are still operating. Factors that may affect the speed of the power transition between sources may include load currents of the client circuits and filtering capacitance present on the client supply domain. Conventional battery backup switching solutions may rely on a comparator as a sensing device which then controls the main and backup power switches. However, in one embodiment of the present disclosure, system 100 may integrate the sensing and controlling circuits into a novel arrangement of transistors to perform accurate control of power switches using very low power and silicon area. The transistors may include metal-oxide-semiconductor field-effect transistor (MOS or MOSFETS). System 100 may solve technical problems with use of comparators or diodes for power control by keeping the power consumption and silicon area at very low levels.

System 100 may include a main power source 104 and a backup power source 102. Power from one of these may be applied to one or more client modules 116 or circuits. The power may be applied in parallel with a filtering capacitor 114. The current through client modules 116 may be specified as a Iload. In one embodiment, system 100 may evaluate the power levels of sources 102, 104 and switch to which one of sources 102, 104 is higher. In another embodiment, system 100 may switch to another one of sources 102, 104 which the power of a first one of sources 102, 104 falls below a threshold level or another operating condition is met.

System 100 may include switches 118, 112. Switches 118, 112 may be implemented by MOSFETs, other transistors, or other suitable devices. Switches 118, 112 may control the application of power sources 104, 106, including selecting which is applied to client modules 116, and in what manner which power supply is applied to client modules 116.

System 100 may include analog circuitry, digital circuitry, or a suitable combination of both to control which of power sources 104, 106 will be applied to client modules 116. In one embodiment, system 100 may include a client voltage monitor 106. In another embodiment, system 100 may include a dynamic supply-level shifter 108. In yet another embodiment, system 100 may include a double controlled latch 110. Each of monitor 106, shifter 108, and latch 110 may be communicatively coupled or coupled to each other. Furthermore, each of monitor 106, shifter 108, and latch 110 may be communicatively coupled to power sources 102, 104.

Monitor 106 may be configured to evaluate the voltage applied to client modules 116. Monitor 106 may be implemented in analog circuitry, digital circuitry, or a suitable combination of both. Monitor 106 may include an input of the output of voltage as applied to client modules 116.

Latch 110 may be configured to receive input from shifter 108. Latch 110 may be implemented in analog circuitry, digital circuitry, or a suitable combination of both. Latch 110 may be controlled in part by shifter 108 and the input therefrom.

Shifter 108 may be configured to receive input from monitor 106. Shifter 108 may be implemented in analog circuitry, digital circuitry, or a suitable combination of both. Shifter 108 may operate in a class B or class AB mode. Shifter 108 may be controlled in part by monitor 106 and the input therefrom. In a class B mode of operation, shifter 108 may utilize circuits that do not draw any power in quiescent mode. The current is zero amperes unless current is moving at the input of the shifter 108. In a class AB mode of operation, shifter 108 may utilize circuits that require some, albeit small, current at all times. The quiescent current for such a mode of operation is non-zero. Use of class B versus class B mode of operation may depending upon filtering capacitor 114. If the capacitance of filtering capacitor 114 is sufficiently high, class B mode of operation can be used, as class b is slower. If the filter is slow, the filter can provide some current during switching of sources between sources 102, 104. Use of a class B level shifter may dramatically increase (compared to other solutions) the sensitivity of latch 110, reducing the needed filtering capacitance for a given voltage undershoot on the client supply domain with a virtually zero current consumption. Use of a class AB level shifter version may further improve sensitivity, but possibly at the expense of a greater quiescent current consumption. Nevertheless, use of a class AB level shifter may still require current that is many times smaller in comparison to a comparator-based solution.

System 100 may operate seamlessly with respect to providing power to client modules 116 during switching of sources 102, 104. Feedback within system 100 may ensure that the source of sources 102, 104 with the best voltage, current, or power available is used. System 100 may require low, virtually zero bias current; low, virtually zero voltage drop; and a low filtering capacitance.

Figure 2:
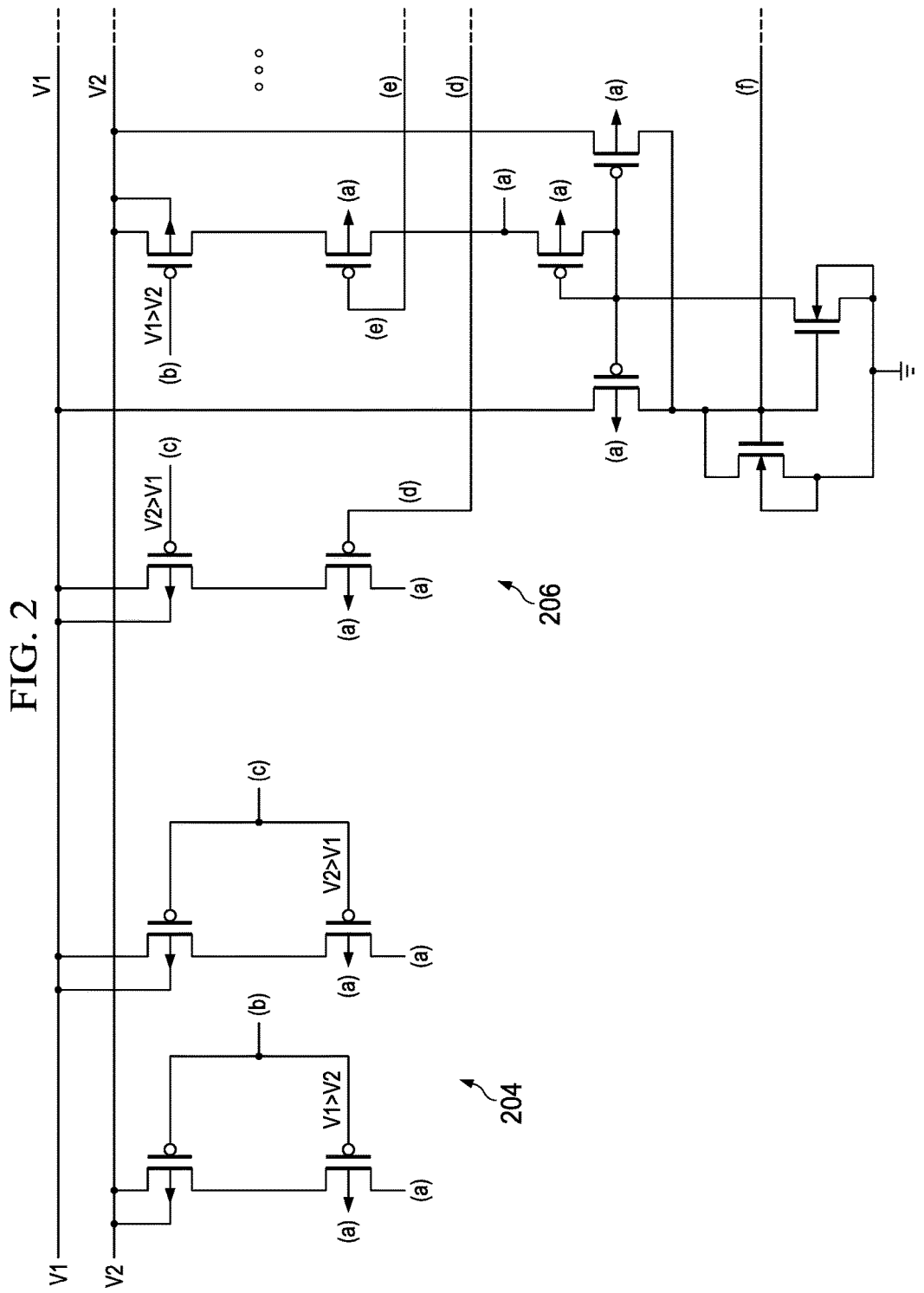
FIG. 2 is a more detailed illustration of example switches and an example monitor, in accordance with embodiments of the present disclosure.
Figure 3:
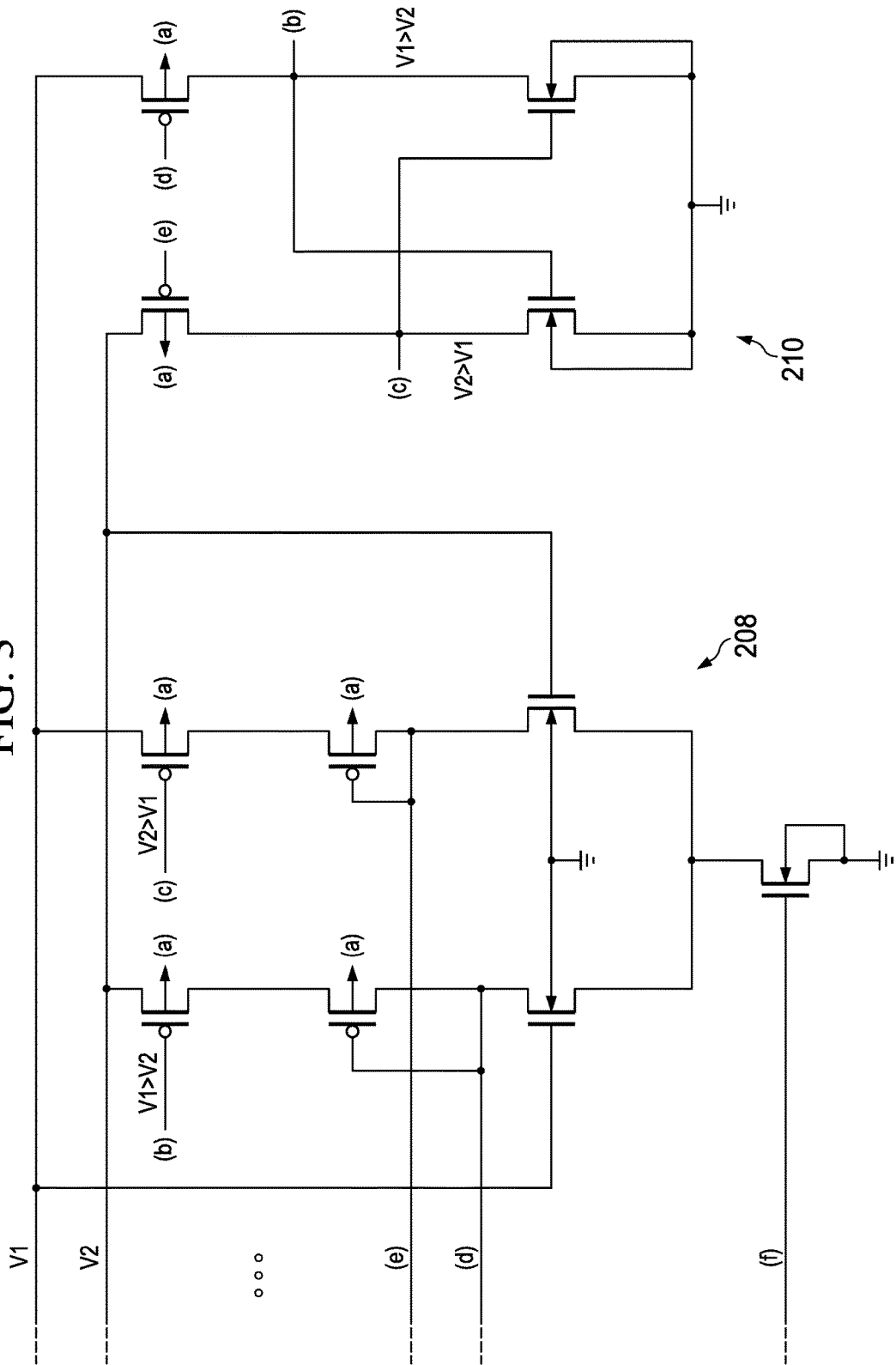
FIG. 3 is a more detailed illustration of an example shifter and latch, in accordance with embodiments of the present disclosure.

Example embodiments of each of monitor 106, latch 110, and shifter 108 are illustrated in more detail in FIGS. 2 and 3. Each of these may be implemented with transistors such as pairs of MOSFETs in series. However, other transistors may be used instead, such as MOS power switches, NMOS, or PMOS transistors connected in series or parallel. In one embodiment, each of monitor 106, latch 110, and shifter 108 may be aware of voltage domain requirements while power is switched between sources 102, 104.

FIG. 2 is a more detailed illustration of example switches and an example monitor, in accordance with embodiments of the present disclosure.

Switches 204 may implement switches 110, 114. Switches 204 may include inputs (b), (c) from a latch. Switches 204 may be respectively connected to a first voltage V1 and a second voltage V2. First voltage V1 may represent a source such as source 102, while second voltage V2 may represent a source such as source 104.

Monitor 206 may implement monitor 106. When the client voltage is lower than the maximum of the two supplies, voltages V1, V2, a current is injected in the circuit, which is mirrored and used in the next section of the circuit representing the latch. The higher the error or difference between the client voltage and the maximum of the two supplies, the higher the current that is generated. This may force the latch to switch supplies.

FIG. 3 is a more detailed illustration of an example shifter and latch, in accordance with embodiments of the present disclosure. Shifter 208 may implement shifter 108. Latch 210 may implement latch 110.

Shifter 208 may receive a current from monitor 206. The current received from monitor 206 may be steered to diode-connected transistors, creating higher voltage drops as the current is higher. The signals resulting may drive the gates of latch 210. The switches on the top of shifter 208 may be driven by latch 210. This may ensure that no unwanted current will flow through the diode-connected devices.

Latch 210 may receive two pairs of input signals. A first pair is made from voltages V1, V2 and is applied on the sources of p-channel devices. The other pair may be cross coupled from shifter 208. Each may be applied at the other's gate. The outputs of latch 210 may be applied to switches 204 to drive switching between V1 and V2.

Figure 4:
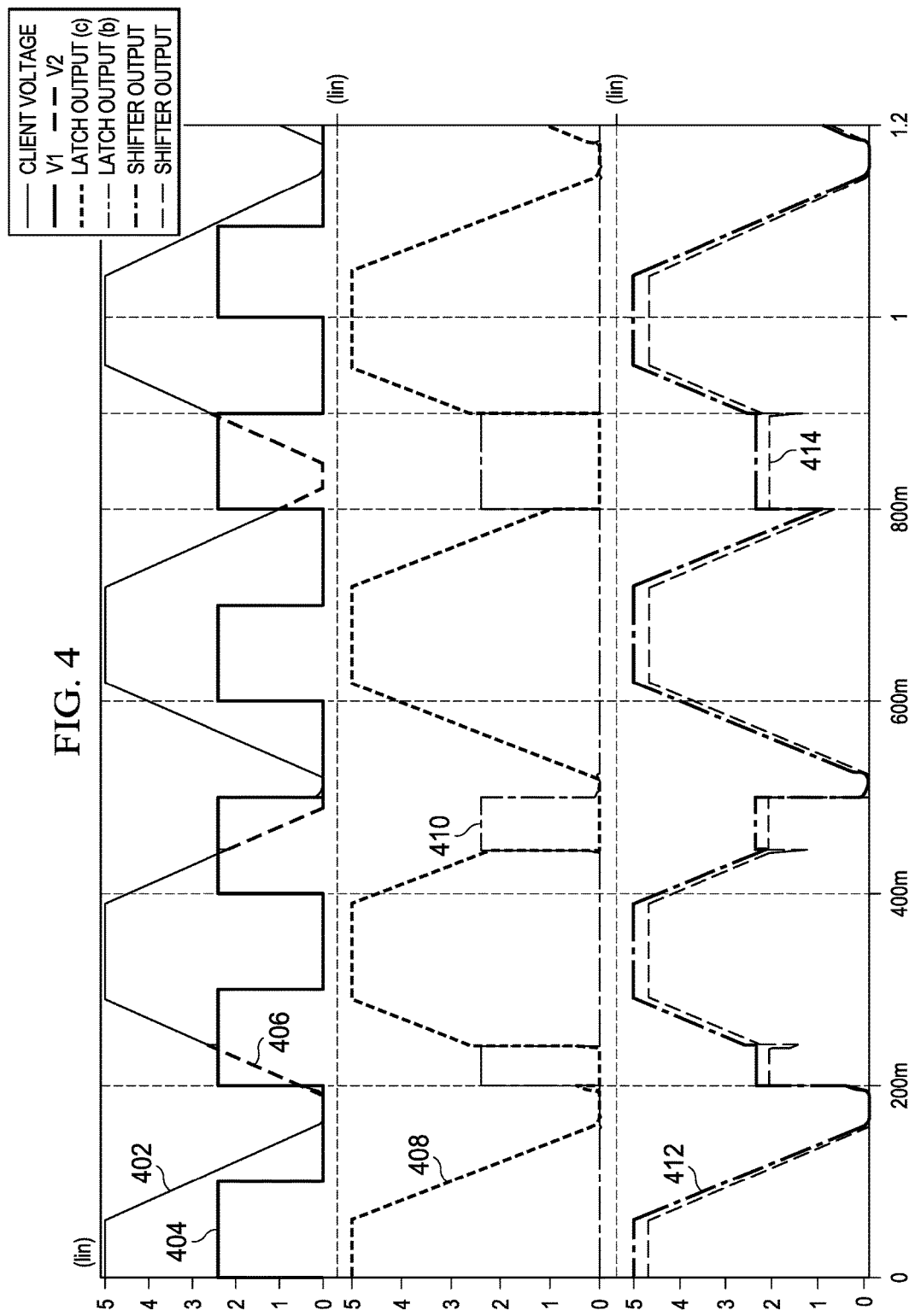
FIG. 4 illustrates example waveforms and timing diagrams of a system for seamless switching control during operation, according to embodiments of the present disclosure.

FIG. 4 illustrates example waveforms and timing diagrams of system 100 during operation, according to embodiments of the present disclosure.

Waveform 402 may show the voltage applied to client modules 116 over time. Waveform 404 may show example values of V1 as it may vary over time. Waveform 406 may show example values of V2 as it may vary over time. As V2 dips below V1, the output of the system may be assigned as V1. As V2 rises above V1, the output of the system may be assigned as V1. The output of voltage to client modules 116 may be the larger of V2 or V1. Thus, waveform 402 may track the larger of waveforms 406, 408 over time.

Waveform 408 may show the latch output denoted as "(c)" in FIGS. 2-3, used to determine when V2 is greater than V1. Waveform 410 may show the latch output denoted as "(b)" in FIGS. 2-3, used to determine when V1 is greater than V2.

Waveforms 412, 414 may show the shifter outputs.

Figure 5:
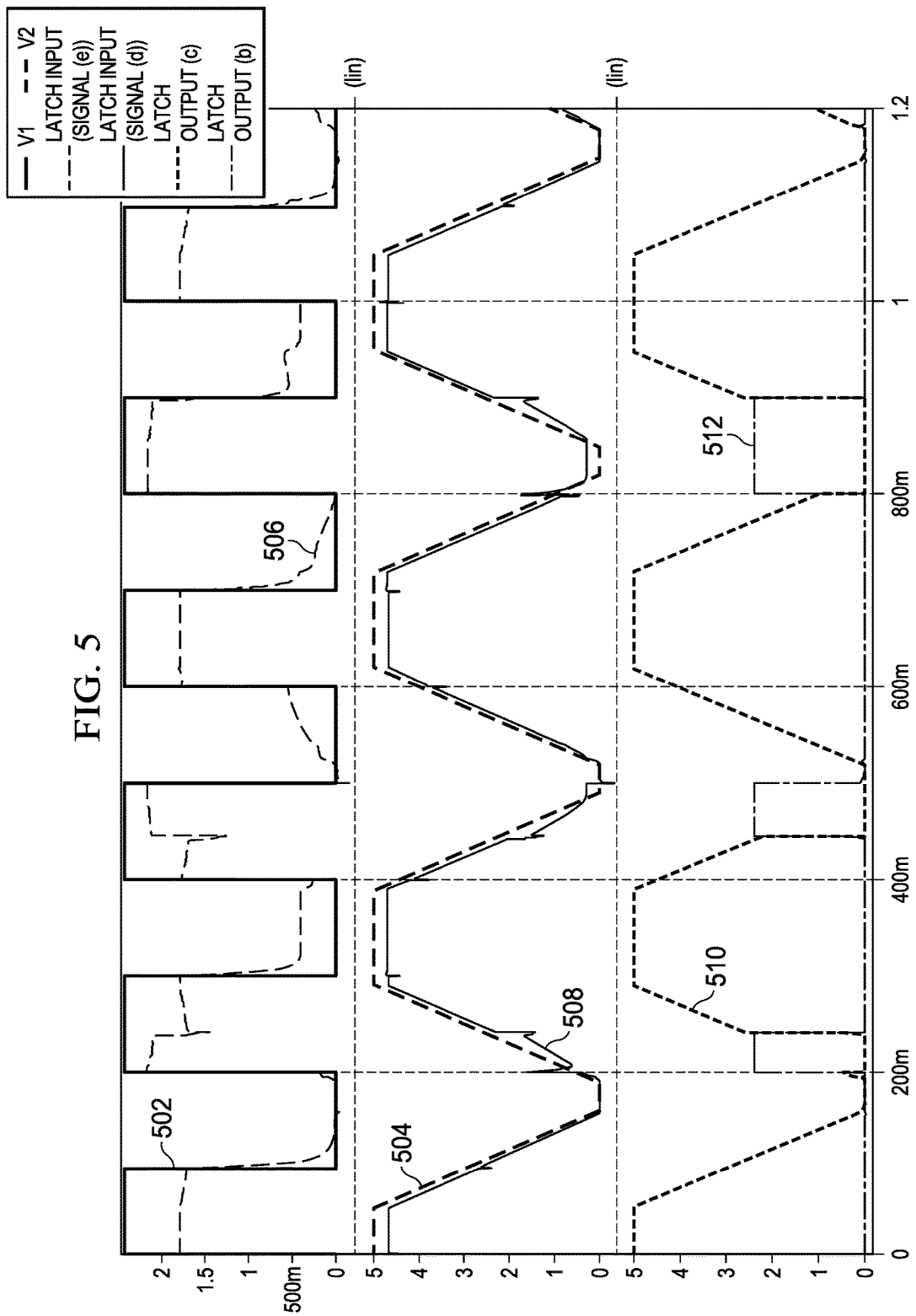
FIG. 5 illustrates further example waveforms and timing diagrams of a system for seamless switching control during operation, according to embodiments of the present disclosure.

FIG. 5 illustrates further example waveforms and timing diagrams of system 100 during operation, according to embodiments of the present disclosure.

Waveforms 502 and 504 may illustrate V1 and V2, just as shown in FIG. 4. Waveforms 510 and 512 may illustrate latch outputs "(c)" and "(b)", just as shown in FIG. 4.

Waveforms 506 and 508 may illustrate latch inputs "(e)" and "(d)" from FIGS. 2-3, respectively.

Although particular embodiments, selections, and configurations are shown in the present disclosure, modifications, additions, subtractions, and other changes may be made to the teachings of the present disclosure without departing from the scope of this disclosure.

The invention claimed is:

1. A circuit for providing back-up power, comprising:
   a switching circuit configured to be coupled to a first power source and a second power source;
   a domain voltage level monitor circuit coupled with the first power source and the second power source and with output of the switching circuit;
   a dynamic level shifter circuit coupled with the first power source and the second power source and an output of the domain voltage level monitor; and
   a double controlled latch circuit coupled with the first power source and the second power source and an output of the dynamic level shifter circuit, the double controlled latch circuit configured to: provide control signals to the switching circuit;
   wherein the dynamic level shifter circuit is further configured to issue a pair of signals to the double controlled latch circuit as input for the double controlled latch circuit, wherein each signal of the pair of signals is not the inverse of another signal of the pair of signals.

2. The circuit according to claim 1, the switching circuit comprises two p-channel MOSFETs.

3. The circuit according to claim 1, wherein the double controlled latch circuit is configured to generate complementary output signals fed to the switching circuit.

4. The circuit according to claim 1, wherein the double controlled latch circuit is configured receive a first input signal and a second input signal from the dynamic level shifter circuit, wherein:
   the first input signal is communicatively coupled to a drain of a first transistor of the double controlled latch circuit;
   the first input signal is communicatively coupled to a gate of a second transistor of the double controlled latch circuit;
   the second input signal is communicatively coupled to a drain of the second transistor of the double controlled latch circuit; and
   the second input signal is communicatively coupled to a gate of the first transistor of the double controlled latch circuit.

5. The circuit according to claim 1, wherein the client voltage monitor circuit is configured to inject a current to drive the dynamic level shifter circuit based upon a difference between the first power source, the second power source, and output of the switching circuit.

6. The circuit according to claim 1, wherein the dynamic level shifter circuit is configured to create voltage drops according to a voltage received from the client voltage monitor circuit.

7. A microcontroller, comprising:
   a peripheral circuit;
   a switching circuit configured to be coupled to a first power source and a second power source and provide power to the peripheral circuit;
   a domain voltage level monitor circuit coupled with the first power source and the second power source and with output of the switching circuit;
   a dynamic level shifter circuit coupled with the first power source and the second power source and an output of the domain voltage level monitor; and
   a double controlled latch circuit coupled with the first power source and the second power source and an output of the dynamic level shifter circuit, the double controlled latch circuit configured to: provide control signals to the switching circuit;
   wherein the dynamic level shifter circuit is further configured to issue a pair of signals to the double controlled latch circuit as input for the double controlled latch circuit, wherein each signal of the pair of signals is not the inverse of another signal of the pair of signals.

8. The microcontroller according to claim 7, the switching circuit comprises two p-channel MOSFETs.

9. The microcontroller according to claim 7, wherein the double controlled latch circuit is configured to generate complementary output signals fed to the switching circuit.

10. The microcontroller according to claim 7, wherein the double controlled latch circuit is configured receive a first input signal and a second input signal from the dynamic level shifter circuit, wherein:
    the first input signal is communicatively coupled to a drain of a first transistor of the double controlled latch circuit;
    the first input signal is communicatively coupled to a gate of a second transistor of the double controlled latch circuit;
    the second input signal is communicatively coupled to a drain of the second transistor of the double controlled latch circuit; and
    the second input signal is communicatively coupled to a gate of the first transistor of the double controlled latch circuit.

11. The microcontroller according to claim 7, wherein the client voltage monitor circuit is configured to inject a current to drive the dynamic level shifter circuit based upon a difference between the first power source, the second power source, and output of the switching circuit.

12. The microcontroller according to claim 7, wherein the dynamic level shifter circuit is configured to create voltage drops according to a voltage received from the client voltage monitor circuit.

13. A system comprising:
a first power source;
a second power source;
a peripheral circuit;
a switching circuit configured to be coupled to the first power source and to the second power source and provide power to the peripheral circuit;
a domain voltage level monitor circuit coupled with the first power source and the second power source and with output of the switching circuit;
a dynamic level shifter circuit coupled with the first power source and the second power source and an output of the domain voltage level monitor; and
a double controlled latch circuit coupled with the first power source and the second power source and an output of the dynamic level shifter circuit, the double controlled latch circuit configured to: provide control signals to the switching circuit;
wherein the dynamic level shifter circuit is further configured to issue a pair of signals to the double controlled latch circuit as input for the double controlled latch circuit, wherein each signal of the pair of signals is not the inverse of another signal of the pair of signals.

14. The system according to claim 13, the switching circuit comprises two p-channel MOSFETs.

15. The system according to claim 13, wherein the double controlled latch circuit is configured to generate complementary output signals fed to the switching circuit.

16. The system according to claim 13, wherein the second power source is a battery.

17. The system according to claim 13, further comprising at least one load coupled with a pin of a microcontroller of the system, wherein the pin is coupled with the output of the first and second switch.

18. The circuit according to claim 1, wherein the dynamic level shifter circuit is further configured to issue a pair of non-complementary signals to the double controlled latch circuit as input for the double controlled latch circuit.

19. A method for providing back-up power, comprising:
coupling a switching circuit to a first power source and a second power source;
coupling a domain voltage level monitor circuit with the first power source and the second power source and with output of the switching circuit;
coupling a dynamic level shifter circuit with the first power source and the second power source and an output of the domain voltage level monitor;
coupling a double controlled latch circuit with the first power source and the second power source and an output of the dynamic level shifter circuit; and
with the double controlled latch circuit, providing control signals to the switching circuit; and
with the dynamic level shifter circuit, issuing a pair of signals to the double controlled latch circuit as input for the double controlled latch circuit, wherein each signal of the pair of signals is not the inverse of another signal of the pair of signals.

20. The method of claim 19, further comprising generating complementary output signals to fed to the switching circuit.

21. The method of claim 19, further comprising:
receiving, with the double controlled latch circuit, a first input signal and a second input signal from the dynamic level shifter circuit, wherein:
the first input signal is communicatively coupled to a drain of a first transistor of the double controlled latch circuit;
the first input signal is communicatively coupled to a gate of a second transistor of the double controlled latch circuit;
the second input signal is communicatively coupled to a drain of the second transistor of the double controlled latch circuit; and
the second input signal is communicatively coupled to a gate of the first transistor of the double controlled latch circuit.

22. The method of claim 19, further comprising, with the client voltage monitor circuit, injecting a current to drive the dynamic level shifter circuit based upon a difference between the first power source, the second power source, and output of the switching circuit.

23. The method of claim 19, further comprising, with the dynamic level shifter circuit, creating voltage drops according to a voltage received from the client voltage monitor circuit.

\* \* \* \* \*